United States Patent

Endoh et al.

[11] Patent Number: 5,961,361
[45] Date of Patent: Oct. 5, 1999

[54] METHOD FOR MANUFACTURING ELECTRODE PLATE FOR PLASMA PROCESSING DEVICE

[75] Inventors: Shosuke Endoh, Nirasaki; Masaaki Mitsuno, Chigasaki, both of Japan

[73] Assignees: Tokyo Electron Limited; Tokai Carbon Co., Ltd, both of Tokyo, Japan

[21] Appl. No.: 08/935,067

[22] Filed: Sep. 22, 1997

[30] Foreign Application Priority Data

Oct. 24, 1996 [JP] Japan ..................................... 8-299717

[51] Int. Cl.$^6$ ...................................................... H01J 9/12
[52] U.S. Cl. ........................ 445/49; 156/345; 204/298.31; 204/298.33
[58] Field of Search ............................... 445/49; 156/345, 156/643; 204/298.31, 298.33

[56] References Cited

U.S. PATENT DOCUMENTS

| | | | |
|---|---|---|---|
| 4,582,632 | 4/1986 | Rokujo et al. | 252/502 |
| 5,324,411 | 6/1994 | Ichishima et al. | 204/298.33 |
| 5,853,523 | 12/1998 | Machida et al. | 156/345 |

FOREIGN PATENT DOCUMENTS

| | | |
|---|---|---|
| 5-320955 | 12/1993 | Japan . |
| 5-347276 | 12/1993 | Japan . |
| 5-347278 | 12/1993 | Japan . |
| 6-128762 | 5/1994 | Japan . |
| 7-22385 | 1/1995 | Japan . |
| 7-114198 | 12/1995 | Japan . |
| 7-115853 | 12/1995 | Japan . |
| 8-14033 | 2/1996 | Japan . |

*Primary Examiner*—Nimeshkumar D. Patel
*Assistant Examiner*—Michael J. Smith
*Attorney, Agent, or Firm*—Oblon, Spivak, McClelland, Maier & Neustadt, P.C.

[57] ABSTRACT

A method manufactures an electrode plate for a plasma processing device in which a semiconductor wafer is processed to form a highly integrated circuit. The method includes a curing step of heat-curing a liquid thermosetting resin to prepare a resin forming material one or two backing steps of carbonizing the heat-cured resin forming material by heating under a non-oxidizing atmosphere to prepare a baking material composed of glass-like carbon and a polishing step of polishing one face of the baking material, which is exposed to plasma, to a depth of 20 $\mu$m to 1.25 mm.

6 Claims, 2 Drawing Sheets

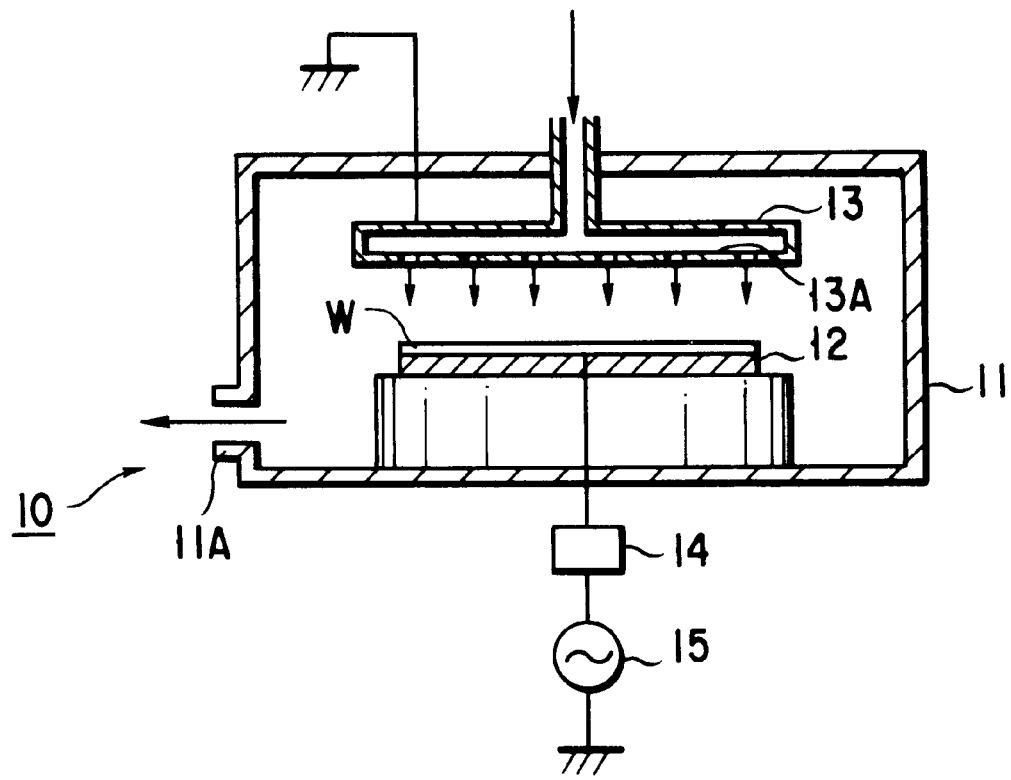
F I G. 1
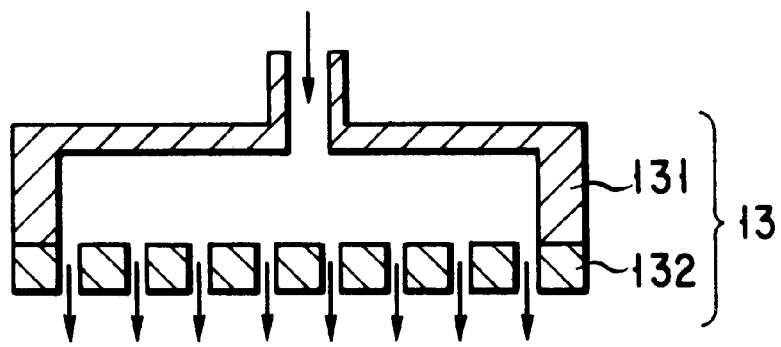
F I G. 2

METHOD FOR MANUFACTURING ELECTRODE PLATE FOR PLASMA PROCESSING DEVICE

BACKGROUND OF THE INVENTION

This invention relates to a method for manufacturing an electrode, particularly an electrode plate composed of glass-like carbon, which is used for a source for generating a plasma of a plasma processing device.

A plasma processing device is typically used in the case where the surface of a subject material such as a semiconductor wafer or the like is processed in a processing chamber by a plasma process such as plasma CVD, plasma etching, or the like to form a device such as a highly integrated circuit or the like on the surface of the subject material. The plasma processing device generally produces plasma of process gas for etching, formation of a thin film, or the like by a plasma source in a highly vacuumed process chamber to provide the subject material with etching or to form a thin film on the surface of the subject material. The plasma generating source is provided with, for example, an electrode to which a high frequency voltage is applied and an earth electrode pairing with the above electrode and produces glow discharge between the pair of electrodes in process gas as a medium to produce plasma.

Conventionally, particles are removed from a process chamber to an extreme to prevent adhesion of the particles to a fine integrated circuit since multiple integrated circuits formed by a plasma process are formed on one wafer in a high density (highly integrated circuit). Other than electric conductivity, the characteristics required for the electrode used for the plasma source include high purity and resistance to plasma corrosion to restrain the generation of the above particles. At present, an electrode composed of glass-like carbon is thought to be useful for the electrode which satisfies these characteristics. Various trials for developing a material used as the glass-like carbon electrode capable of limiting the generation of extremely fine particles have been made and various glass-like carbon electrodes have been proposed.

For example, various electrodes, in which the properties such as a purity, porosity, pore diameter, crystal structure, and the like are improved, are proposed in the following official reports. Disclosed in Jpn. Pat. Appln. KOKOKU Publication No. 7-115853 is a carbon material used for a plasma apparatus comprising a glass-like carbon material characterized in that the glass-like carbon material prepared by carbonized baking has a porosity of from 0.02 to 0.2%, the crystal lattice of the glass-like carbon material is not detected by X-ray diffraction, and the content of impurities is 5 ppm or less. In Jpn. Pat. Appln. KOKOKU Publication No. 7-114198, disclosed is an electrode plate for plasma etching comprising a glass-like carbon of high purity, which has the structural characteristics in which a maximum pore diameter of 1 $\mu$m or less, an average pore diameter of 0.7 $\mu$m or less, and a porosity of 1% or less. Jpn. Pat. Appln. KOKOKU Publication No. 8-14033 discloses an electrode plate for plasma etching characterized in that the electrode plate is formed of a plate material with a thickness of 2 mm or more, which is composed of glass-like carbon of high purity, there is substantially no grain boundary on the surface and inside the structure, and maximum pore diameter is 1 $\mu$m or less. Jpn. Pat. Appln. KOKAI Publication No. 5-320955 discloses an electrode plate for plasma etching comprising a glass-like carbon having the characteristics including purity characteristics in which the total ash content is 5 ppm or less, the content of metal impurities is 2 ppm or less, and the content of total sulfur is 30 ppm or less; crystal characteristics in which the spacing of crystal planes (002) is 0.375 nm or less and the size of the unit lattice is 1.3 nm or more; and the material characteristics in which the specific gravity is 1.50 or more and the flexural strength is 1,100 Kgf/cm$^2$ or more.

Also, the technologies which specify raw materials for the glass-like carbon are proposed, for example, in the following official reports. An electrode plate for plasma etching comprising a glass-like carbon produced using a phenol resin and a polycarbodiimide resin as the raw materials is disclosed in Jpn. Pat. Appln. KOKAI Publication No. 5-347276. Also, an electrode plate for plasma etching comprising a glass-like carbon material produced using a polycarbodiimide resin as the raw material is disclosed in Jpn. Pat. Appln. KOKAI Publication No. 5-347278.

Other than the above technologies, the technologies in which the configuration or surface shape of an electrode is improved have been proposed. For example, Jpn. Pat. Appln. KOKAI Publication No. 6-128762 discloses an electrode plate for plasma etching comprising a glass-like carbon in which Rmax indicating the surface roughness of the portion consumed by plasma is 6 $\mu$m or less. Also, disclosed in Jpn. Pat. Appln. KOKAI Publication No. 7-22385 is an electrode plate for RIE made from glass-like carbon having a plurality of gas through holes formed by processing, wherein the inner wall of the gas through holes is formed of a material with a baked surface.

As above-mentioned, various material progresses in glass-like carbon used for plasma processors have been made and are conventionally proposed. However, the integrated circuit inevitably has the wiring structure, in which the width of a wire is in a level of a quarter micron, with recent progress in integration of an integrated circuit. Even extremely fine particles, which exhibit no problem in conventional plasma processors, cause troubles in recent plasma processing device. The cause and place enabling such extremely fine particles to generate are not clear so that there is the problem that it is difficult to prevent the generation of the extremely fine particles only by the conventional material progress.

BRIEF SUMMARY OF THE INVENTION

An object of the invention is to provide a method for manufacturing an electrode plate for a plasma processing device, which can outstandingly limit generation of extremely fine particles even in a plasma process for forming a wiring structure of a quarter micron level.

The present inventors studied the relation between a glass-like carbon electrode and extremely fine particles from different angles. As a result, the present inventors elucidated that the glass-like carbon electrode was only slightly consumed during plasma processing, the electrode itself was not consumed enough to show that it was a source of the extremely fine particles, and the extremely fine particles were decomposed products in plasma. It was also confirmed that the glass-like carbon electrode possesses a structure of the surface on which the decomposed products in plasma tend to accumulate and that primarily the decomposed products accumulated on the electrode fell down on the subject material as the extremely fine particles. In this situation, the present inventors have undertaken extensive studies and, as a result, obtained the knowledge in which a surface structure having a resistance to the accumulation of the decomposed products in plasma on the electrode surface was obtained by applying specific treatment to the surface of the glass-like carbon when manufacturing the electrode from the glass-like carbon.

Accordingly, the above object can be attained in the present invention by a provision of a method for manufacturing an electrode plate for a plasma processing device, comprising:

a curing step of heat-curing a liquid thermosetting resin to prepare a resin forming material;

a baking step of carbonizing the heat-cured resin forming material by heating under a non-acidic atmosphere to prepare a baking material composed of glass-like carbon; and a step of polishing at least one face of the baking material, which is exposed to plasma, to a depth of at least 20 $\mu$m.

Also, the above object can be attained in the present invention by a provision of a method for manufacturing an electrode plate for a plasma processing device, comprising:

a curing step of heat-curing a liquid thermosetting resin to prepare a resin forming material;

a step of polishing at least one face of the resin forming material, which is exposed to plasma, to a depth of at least 25 $\mu$m; and a baking step of carbonizing the polished resin forming material by heating under a non-oxidizing atmosphere to prepare a baking material composed of glass-like carbon.

Additional object and advantages of the invention will be set forth in the description which follows, and in part will be obvious from the description, or may be learned by practice of the invention. The object and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 1 is a view schematically showing a structure of a plasma processing device possessing a glass-like carbon electrode plate manufactured by a method of an embodiment according to the present invention;

FIG. 2 is an enlarged sectional view of the upper electrode of the plasma processing device shown in FIG. 1.

DETAILED DESCRIPTION OF THE INVENTION

Figure 3A:
FIGS. 3A to 3E are typical views for explaining the curing processes when a primary polycondensation of a thermosetting resin is heat-cured.

The present invention will now be explained in detail based on the embodiments shown in FIGS. 1, 2, and 3A to 3E.

First, a plasma processing device 10 is explained. The plasma processor 10, as shown in FIG. 1, includes a process chamber 11 provided with an airtight structure capable of keeping a prescribed vacuum; a lower electrode 12 which is installed on a susceptor disposed on the bottom of the process chamber 11 and which supports a semiconductor wafer W as a subject material thereon; and an upper electrode 13 with a hollow disk shape. The upper electrode 13 is disposed at the upper portion of the process chamber 11 so as to face the lower electrode 12 and thus the wafer W. A high frequency power supply 15 is connected with the lower electrode 12 via a matching circuit 14. The upper electrode 13 has a lower wall or plate, that is, an electrode plate facing the lower electrode, in which a plurality of through-holes 13A are formed. The upper electrode 13 is grounded. An exhaust nozzle 11A is attached to the lower portion of peripheral wall of the process chamber 11. A vacuum pump, though not shown, is connected with the exhaust nozzle 11A through an exhaust pipe. Air of the process chamber 11 is evacuated by the vacuum pump to maintain a prescribed degree of vacuum in the process chamber 11. A gas source (not shown) for supplying process gas for plasma processing is connected to the internal space of the upper electrode 13 through a pipe. As shown by the arrow, process gas is introduced into the internal space of the upper electrode 13 and supplied to the inside of the process chamber 11.

The above upper electrode 13, as shown in FIG. 2, includes a support electrode 131 made of a metallic cylinder with a large diameter and an opening at the bottom thereof; and an electrode plate 132 with a circular plate shape, the electrode plate 132 being attached to the lower end of the peripheral wall of the support electrode 131 so as to close the bottom opening and facing the lower electrode 12. The electrode plate 132 is formed from glass-like carbon described below. A port connected with the gas source is provided in the center of the upper wall of the support electrode 131 to introduce process gas into the upper electrode 13. A plurality of through holes or gas injection holes for injecting process gas supplied in to the upper electrode 13 into the process chamber 11, specifically, above the wafer W. At least one baffle plate may be preferably provided in the upper electrode 13 to uniformly distribute the process gas in the electrode.

Next, a method for manufacturing an electrode plate for plasma processing device of the present embodiment will be explained.

A liquid thermosetting resin is used to manufacture the electrode plate 132 for the plasma processor. As the raw material for the thermosetting resin, for example, an initial condensation resin of a phenol type and a furan type or of a polyimide type and polycarbodiimide type, which is refined in advance and has a carbon yield of 40% or more (75% or less), is used. Compounds which are appropriately selected from these raw materials and mixed are used as the liquid thermosetting resin either singly or in combinations of two or more. As required, a hardener or curing agent such as hexamine, p-toluene sulphonic acid, or the like is added to the liquid thermosetting resin. The liquid thermosetting resin prepared in this manner is uniformly mixed and is then formed into a flat plate (circular plate) with a uniform wall thickness by means of injection molding, cast molding, centrifugal molding, or the like (molding step). This forming material is then heat-cured at from 150 to 300° C. to prepare a resin cured forming material (curing step). Next, the both faces of this resin cured forming material of a circular plate shape are held with graphite plates each having a smooth surface and the resin cured forming material is carbonized by heating at from 800 to 2,000° C. in the condition, in which it is embedded in carbonaceous powder or in a non-oxidizing atmosphere using non-acidic gas such as nitrogen, argon, or the like, to prepare a primary baking material (primary baking step). The primary baking material is further heated at from 1,500 to 2,500° C. in the presence of purifying gas such as hydrogen chloride gas or the like to carry out highly purifying treatment so that the content of impurities in a glass-like carbon material is 5 ppm or less to prepare a secondary baking material (secondary baking step). Then, the face of the secondary baking material, which faces the lower electrode 12, is polished to a depth of at least 20 μm, preferably 30 μm, and more preferably 50 μm using hard abrasives such as diamond, alumina, or the like to remove the surface layer thereof (polishing step). This polishing step may be applied to the cured forming material, primary baking material, and/or secondary baking material. As illustrated below, in the case of polishing the cured forming material, it is preferable to polish it to a depth about 5 μm deeper than the above defined depth for the secondary baking material in consideration of shrinkage of a resin caused by baking in the succeeding step.

In the heat-curing reaction in the above-described curing step, a cross-linking structure is gradually formed by a polymerization of the initial condensation of the liquid thermosetting resin. In this reaction, the thermosetting resin is gradually heated from the surface to the inside thereof by heat conduction and hence the polymerization gradually proceeds from the surface to the inside of the forming material. Because the forming material shrinks in this polymerization step, it is important to advance the hardening reaction uniformly so that a glass-like carbon having uniform properties is prepared. However, the structures of the surface and the inside of the forming material have different organization properties since, as above-mentioned, the polymerization proceeds from the surface of the thermosetting resin of the liquid forming material and hence shrinking force acts on the polycondensation of the surface.

Specifically, the surface portion of the initial polycondensation of the thermosetting resin is first heated and a hardening reaction of the surface portion proceeds. The polycondensation of the surface portion shrinks, which causes a plurality of extremely micro-cracks to generate on the surface, and an internal unreacted thermosetting resin is externally exposed from the cracks. A hardening reaction of the exposed portion of the thermosetting resin proceeds. A boundary is formed between the portion of the thermosetting resin in which a hardening reaction first proceeded and the portion of the thermosetting resin in the crack in which a hardening reaction proceeded, to cause, that is, hardening unevenness. When the surface portion is cured, the initial polycondensation of the thermosetting resin is then gradually heated to the inside to link and thereby to form a uniform cross-linking structure, whereby an entirely heat-cured resin forming material is formed.

Figure 3B:
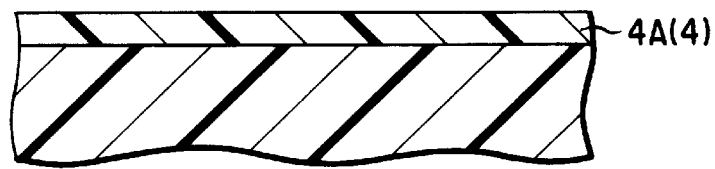
Figure 3C:
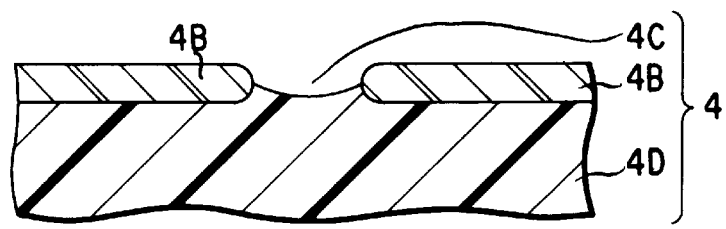
Figure 3D:
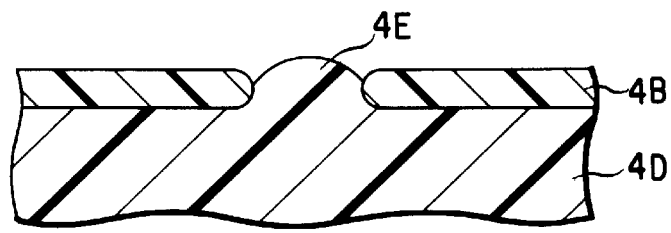
Figure 3E:
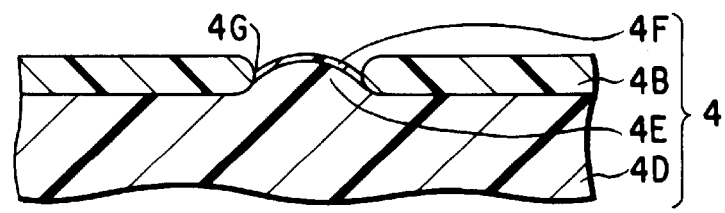

A hardening phenomenon of the above thermosetting resin is now concretely explained with reference to typical views of FIGS. 3A to 3E. When a plate shape liquid forming material 4 (FIG. 3A shows part of the forming material) with a smooth surface, which is made from the initial polycondensation of the thermosetting resin is heated, the initial polycondensation of the thermosetting resin is, as shown in FIG. 3B, gradually heated from the surface and a surface portion 4A starts to heat-cure gradually. A hardening reaction advances to form a first cross-linking structure portion 4B. As shown in FIG. 3C, the cross-linking structure portion 4B gradually shrinks, thereby causing a crack 4C to occur on the surface. Further, an internal uncured initial polycondensation 4D of the thermosetting resin rises from the crack 4C by surface tension as shown in FIG. 4D to form a rising portion 4E. After this, the surface portion of the initial polycondensation of the thermosetting resin in this rising portion 4E is directly heated to heat-cure, whereby a second cross-linking structure portion 4F is formed as shown in FIG. 4E. As a result, a boundary 4G is formed between the original first cross-linking structure portion 4B and the second cross-linking structure portion 4F of the surface of the rising portion 4E, causing hardening unevenness with a boundary 4G to occur on the surface portion of the resin forming material. Then, an entire internal initial polycondensation of the thermosetting resin is gradually heated to cross-link uniformly and thereby to form a resin forming material. When the resin forming material is baked as it is, the boundary 4G remains as hardening unevenness on the surface of the baking material as it stands.

The removal of the boundary 4G is difficult only by mirror-finishing the baking material prepared in the above manner by such a method as described in the above-described Jpn. Pat. Appln. KOKAI Publication No. 6-128762 and hence the boundary 4G still remains. When plasma treatment is carried out using an electrode plate composed of a glass-like carbon in which the boundaries 4G remain in this way, the boundaries 4G are primarily consumed; a micro-crack grows in the boundary portion; the decomposed products generated in the step of plasma treatment accumulate in the crack; also in the step of plasma treatment, the decomposed products grow in the accumulated portion; and the grown deposit is peeled off from the electrode plate (particularly the electrode plate of the upper electrode) to fall on the wafer as micro-particles.

It was confirmed in experiments carried out by the present inventors that the cured resin may be polished to a depth of at least 20 μm, preferably 30 μm, and more preferably 50 μm to remove the surface portion, thereby eliminating the influence of the boundaries 4G. The greater the polishing depth is, the more eliminated the influence of the boundaries 4G is. However, if the depth is too much, it causes drawbacks such as loss of the polishing time, loss of materials. Therefore, the maximum limit of the polishing depth in practical use is about 1.00 mm. Also, it was confirmed that such a polishing effect can be obtained in the polishing of the primary baking material and the cured forming material in the similar manner as in the polishing of the secondary baking material.

If the electrode plate composed of the glass-like carbon manufactured in the present embodiment, characterized in that the surface portion in which the boundaries 4G remain, is removed by polishing the resin forming material or the baking material, the surface of the electrode plate is uniformly consumed in a plasma process without accumulation of decomposed products and hence extremely micro-particles are substantially prevented from falling on a wafer.

As above-mentioned, in the present embodiment, the surface layer of the baking material, which faces the lower electrode, is removed by polishing the surface to a depth of at least 20 μm or the surface of the resin forming material is removed to a depth of at least 30 μm after the curing step, followed by baking and polishing. Hence, the boundaries 4G formed on the surface of the resin forming material in the curing step can be removed. Therefore, when the electrode plate composed of the glass-like carbon is consumed in a plasma process, the surface of the electrode plate is slightly consumed uniformly. Also, the surface of the electrode is always maintained in a flat condition and decomposed products generated in a plasma process are accumulated only with difficulty. Further, the generation of particles derived from the electrode is efficiently avoided. The present embodiment has not only the above advantages but also the advantage that an electrode contributing to improvement in yield can be manufactured.

Also, as other embodiment of the present invention, there is a method in which the surface of a resin forming material is polished and removed before a baking material of the resin forming material is prepared. In this process, the surface of the resin forming material is polished to a depth of at least 25 $\mu$m, preferably 37.5 $\mu$m, and more preferably 62.5 $\mu$m (1.25 mm or less) to remove the surface layer. Next, the polished resin forming material is primarily and secondarily baked in the same manner as in the previous embodiment to prepare a baking material, which is then polished for mirror-finishing. Also, the polishing depth in the present embodiment is greater than that in the previous embodiment. However, when the polished resin forming material is baked, the resin forming material shrinks due to the baking process so that the substantially same condition as in the case of polishing the baking material to a depth of about 20 $\mu$m, about 30 $\mu$m, and about 50 $\mu$m is obtained.

Incidentally, the present invention is not limited to the above embodiments at all. Any invention is involved in the present invention if it includes a process in which, in steps of producing an electrode plate composed of glass-like carbon, boundaries in the surface portion, which is formed in a step of curing a thermosetting resin as a raw material is removed from the surface of a resin forming material or a baking material by polishing.

EXAMPLES

A process of the present invention for manufacturing an electrode plate composed of glass-like carbon will be explained in more detail by way of examples.

EXAMPLE 1

This example relates to a method for removing at least 25 $\mu$m thickness of the surface layer of a resin forming material after a curing step. Specifically, a initial polycondensation of a furan resin which was purified was used as a raw material. To 100 parts by weight of this raw material was added 0.6 parts by weight of a hardener (p-toluenesulfonic acid) and mixed to prepare a raw resin liquid. The raw resin liquid was poured into a vat made of polyethylene and foam-removing treatment was carried out under reduced pressure (10 Torr or less) for 3 hours. The raw resin liquid was then placed in an electric furnace and was allowed to stand at 80° C. day and night. Next, a forming material was taken out from the vat and was heated in atmosphere at 200° C. for 24 hours, thereby providing the initial polycondensation of the thermosetting resin with cure-treatment to prepare a resin forming material with a circular shape of 5 mm thickness and 350 mm diameter. This resin forming material was prepared plurally.

Then, the surface of each of the above resin forming material was polished using alumina abrasives to remove the surface layer, for example, of a thickness of 25 $\mu$m. Each of the resin forming material was subsequently held in a graphite plate of high purity. The resin forming material was placed in an electric furnace in this state, was embedded in carbonaceous powder, and was heated to 1,000° C. at a rising rate of 2° C./hr to carry out carbonizing-baking treatment and thereby to prepare each primary baking material composed of glass-like carbon. The thickness of the primary baking material was about 4 mm.

Next, plurality of through-holes with a diameter of 0.5 mm was provided by electric discharge processing in the substantially entire face of the primary baking material at equal intervals of 2 mm. The primary baking material was transferred to an electric furnace, in which it was heated at 2,000° C. while supplying purified chlorine gas (mol ratio of chlorine gas/argon gas =5/95) at a rate of 5 L/min to carry out high purification treatment and thereby to prepare a secondary baking material. A glass-like carbon electrode plate, which had a diameter of 280 mm, a thickness of about 4 mm, a plurality of through-holes, a total ash content of 2 ppm, a mirror face, and a high quality, was manufactured in this manner. After the above glass-like carbon electrode plate was mounted as an electrode plate of an upper electrode in a plasma etching apparatus, an oxide film on an eight inch silicon wafer was processed by plasma etching using $CF_4$ gas as process gas and Ar gas as a carrier gas under reduced pressure (1 Torr) at a power frequency of 380 kHz in a process chamber. After the etching was carried out for 50 hrs, the number of particles having a size of from 0.02 to 0.03 $\mu$m or more, which were dropped on the wafer, was measured using a particle counter manufactured by KLA Co., Ltd. As a result, the number of particles was 30 or less, indicating that the glass-like carbon electrode plate could be sufficiently applied to fine processing requiring an accuracy of the order of quarter micron.

EXAMPLE 2

This example relates to a process in which the surface layer of a baking material was removed to a depth of at least 20 $\mu$m. Specifically, each of the resin forming materials prepared in Example 1 was processed by baking and high-purification treatments in the same conditions as in Example 1 as it is without polishing to prepare a secondary baking material, the surface of which was removed to a depth of 20 $\mu$m. In this manner, a glass-like carbon electrode plate, which had a diameter of 280 mm, a thickness of about 4 mm, a plurality of through-holes, a total ash content of 2 ppm, and a high quality, was manufactured. As a result, an electrode plate with the same thickness as the electrode plate prepared in Example 1 was obtained. The prepared electrode plate was applied to a plasma process apparatus similar to that used in Example 1 and the number of particles was measured in the same manner as in Example 1, showing that the number of particles was almost the same as in Example 1.

The method of the present invention is not limited to the above embodiments, and, in the method of the present invention, the secondary baking material may be surface-treated, for example, by lapping, mirror-finishing, or the like. Also, the sort of a thermosetting resin, a curing process, and baking process, which are utilized in the above embodiments, each shows just one example, and the present invention is not limited to this example.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalent.

We claim:

1. A method for manufacturing an electrode plate for a plasma processing device, comprising:

a curing step of heat-curing a liquid thermosetting resin to prepare a resin forming material;

a baking step of carbonizing said heat-cured resin forming material by heating under a non-oxidizing atmosphere to prepare a baking material composed of glass-like carbon; and a polishing step of polishing at least one face of said baking material, which is exposed to plasma, to a depth of at least 20 $\mu$m.

2. A method for manufacturing an electrode plate for a plasma processing device according to claim 1, wherein said polishing step includes a step of polishing one face of said baking material to a depth of from 20 μm to 1.00 mm.

3. A method for manufacturing an electrode plate for a plasma processing device, comprising:

a curing step of heat-curing a liquid thermosetting resin to prepare a resin forming material;

a step of polishing at least one face of said resin forming material, which is exposed to plasma, to a depth of at least 25 μm; and a baking step of carbonizing said polished resin forming material by heating under a non-oxidizing atmosphere to prepare a baking material composed of glass-like carbon.

4. A method for manufacturing an electrode plate for a plasma processing device according to claim 1, wherein said polishing step includes a step of polishing one face of said resin forming material to a depth of from 25 μm to 1.25 mm.

5. A method for manufacturing an electrode plate for a plasma processing device, comprising:

a curing step of heat-curing a liquid thermosetting resin to prepare a resin forming material;

a primary baking step of carbonizing said heat-cured resin forming material by heating under a non-oxidizing atmosphere to prepare a primary baking material composed of glass-like carbon; and a secondary baking step of heating said primary baking material under a non-oxidizing atmosphere at a temperature higher than in the primary baking step to prepare a secondary baking material; and a polishing step of polishing at least one face of said resin forming material, said primary baking material, and/or said secondary baking material, the face being exposed to plasma, to remove curing uneven portions formed on said one face in said curing step.

6. A method for manufacturing an electrode plate for a plasma processing device according to claim 5, wherein said polishing step includes a step of polishing one face of said resin forming material to a depth of from 25 μm to 1.25 mm or a step of polishing one face of said baking material to a depth of from 20 μm to 1.00 mm.

\* \* \* \* \*